United States Patent
Kauschke

(10) Patent No.: US 12,341,494 B2
(45) Date of Patent: Jun. 24, 2025

(54) ELECTRO ACOUSTIC FILTER COMPONENT AND METHOD OF MANUFACTURING TO REDUCE INFLUENCE OF CHIPPING

(71) Applicant: RF360 SINGAPORE PTE. LTD., Republic Plaza (SG)

(72) Inventor: Thomas Kauschke, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 596 days.

(21) Appl. No.: 17/628,204

(22) PCT Filed: Jul. 9, 2020

(86) PCT No.: PCT/EP2020/069434
§ 371 (c)(1),
(2) Date: Jan. 18, 2022

(87) PCT Pub. No.: WO2021/013574
PCT Pub. Date: Jan. 28, 2021

(65) Prior Publication Data
US 2022/0255531 A1  Aug. 11, 2022

(30) Foreign Application Priority Data
Jul. 25, 2019 (DE) ............. 10 2019 120 178.0

(51) Int. Cl.
*H03H 9/56* (2006.01)
*H03H 3/02* (2006.01)
*H03H 9/13* (2006.01)

(52) U.S. Cl.
CPC ............. *H03H 9/568* (2013.01); *H03H 3/02* (2013.01); *H03H 9/13* (2013.01)

(58) Field of Classification Search
CPC ........ H03H 3/02; H03H 9/02047; H03H 3/08; H03H 9/02133; H03H 9/13;
(Continued)

(56) References Cited

U.S. PATENT DOCUMENTS 6,426,583 B1 * 7/2002 Onishi ............... H03H 9/1085
29/25.35
2005/0134406 A1 6/2005 Inoue
(Continued)

FOREIGN PATENT DOCUMENTS

CN 109217841 A 1/2019
DE 102004001889 A1 4/2005

OTHER PUBLICATIONS

Bauer T., et al., "A Bright Outlook for Acoustic Filtering: A New Generation of Very Low-Profile SAW, TC SAW and BAW Devices for Module Integration," IEEE Microwave Magazine, vol. 16 (7), Aug. 2015 (Aug. 2015), pp. 73-81, XP011662656, [retrieved on Jul. 8, 2015], figures 4-6, sections"Temperature Variation", "Enhanced Filter Performance inImproved Package Technology", "Integration into Modules"; p. 76-p. 78; figures 5,6.
(Continued)

*Primary Examiner* — J. San Martin
(74) *Attorney, Agent, or Firm* — Polsinelli

(57) ABSTRACT

An electro acoustic filter component with improved acoustic and/or electro acoustic performance is provided. The component comprises a piezoelectric material (PM) the sides of which are plane and preferably free from chipping defects. The piezoelectric material may be arranged above a carrier substrate (CS). A functional layer (FL) with plane sides may be arranged above an electrode structure (ES) as trimming, TCF or passivation layer. In the manufacturing method the
(Continued)

Figure 1:
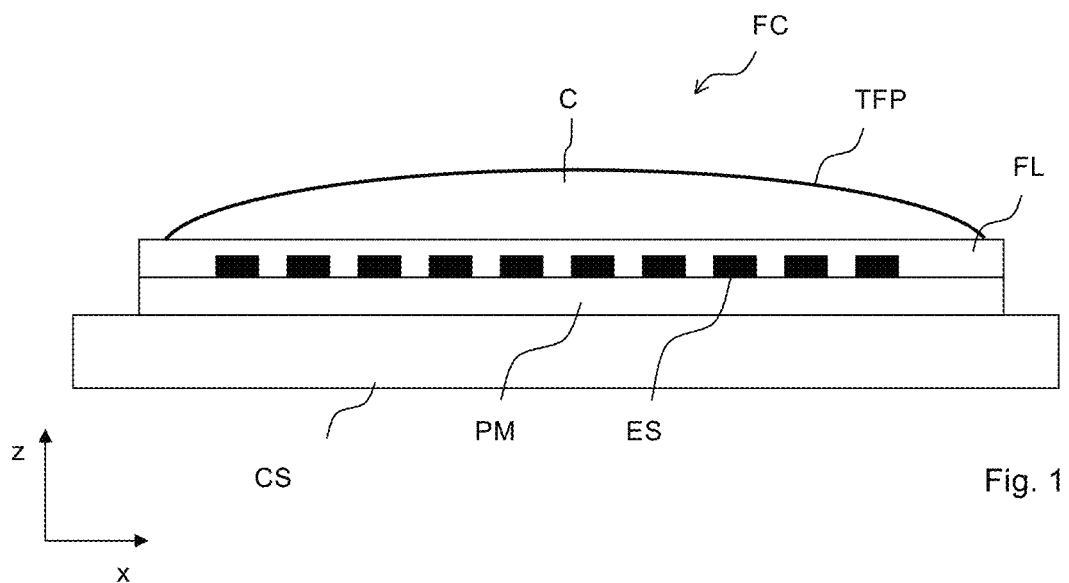

piezoelectric material and the functional layer are removed from the dicing line, such that no chipping occurs for these layers.

10 Claims, 3 Drawing Sheets

(58) Field of Classification Search
CPC .......... H03H 9/02574; H03H 9/02897; H03H 9/568; H03H 9/02629; H03H 9/02102; H03H 9/02834
See application file for complete search history.

(56) References Cited

U.S. PATENT DOCUMENTS

| | | |
|---|---|---|
| 2006/0164186 A1 | 7/2006 | Stoemmer et al. |
| 2011/0266917 A1* | 11/2011 | Metzger ............... H03H 9/0557 |
| | | 29/25.35 |
| 2016/0020749 A1 | 1/2016 | Henn et al. |
| 2016/0294354 A1* | 10/2016 | Saijo ................... H03H 9/0552 |
| 2017/0366163 A1 | 12/2017 | Kishimoto |
| 2019/0149123 A1 | 5/2019 | Sakashita |
| 2019/0288667 A1* | 9/2019 | Hayashi ............. H03H 9/02574 |

OTHER PUBLICATIONS

International Search Report and Written Opinion—PCT/EP2020/069434—ISA/EPO—Sep. 25, 2020.
Mishin Sergey., et al., "Improving Frequency Control of Temperature Compensated Surface Acoustic Wave Devices", IEEE Joint European Frequency and Time Forum & International Frequency Control Symposium (EFTF/IFC), 2013, pp. 111-113, XP032540651, [retrieved on Jan. 2, 2014] abstract section III.
Reinhard W., "Plasma Dicing for Thin Wafers", 2015 European Microelectronics Packaging Conference (EMPC), Maps Europe, Sep. 14, 2015 (Sep. 14, 2015), pp. 1-4, XP032854700, [retrieved on Jan. 25, 2016] the whole document.

* cited by examiner

ELECTRO ACOUSTIC FILTER COMPONENT AND METHOD OF MANUFACTURING TO REDUCE INFLUENCE OF CHIPPING

The present invention refers to electro acoustic filter components and to methods of manufacturing such components.

Electro acoustic filter components can be utilized in RF filters, e.g. for wireless communication devices, to separate wanted RF signals from unwanted RF signals.

Electro acoustic filter components can use electro acoustic resonators such as BAW resonators (BAW=bulk acoustic wave) or SAW resonators (SAW=surface acoustic wave) where an electrode structure is in contact with a piezoelectric material and—when an RF signal is applied to the electrode structure—converts between acoustic and electromagnetic RF signals.

Such resonators can be electrically connected to one another to form RF filters, e.g. in a ladder-type like circuit topology.

The electro acoustic resonators need a cavity in order to allow oscillation of the piezoelectric material. Further, the active structures of electro acoustic resonators must be protected from detrimental environmental influences such as dust or water. It is possible to provide a thin film package including a thin film layer that encloses—together with a carrier substrate—a cavity in which the active structures can be arranged.

Typical methods of manufacturing such components involve manufacturing steps that are applied to a plurality of later-to-be-departed components simultaneously. After the creation of the active structures and the corresponding cavities on a common wafer material, the wafer is singulated into individual elements, e.g. by dicing.

However, such manufacturing processes may result in defects during specific steps such that a perfect hermetical sealing of the active structure cannot be guaranteed.

Thus, it is desired to have a design for electro acoustic components where the active structures have a better protection and to have a corresponding method of manufacturing such components.

To that end, an electro acoustic filter component and a corresponding method of manufacturing according to the independent claims are provided. Dependent claims provide preferred embodiments.

The electro acoustic filter component comprises a piezoelectric material in a piezoelectric layer, an electrode structure in an electrode layer that is arranged on the piezoelectric layer and a cavity above the electrode structure. Sides of the piezoelectric material are plane.

The provision of plane sides such as plane side surfaces of the piezoelectric material means that the corresponding sides are intact and not corrupted, e.g. during manufacturing. Correspondingly, the sides of the piezoelectric material should be as smooth as possible. In this respect, the sides of the piezoelectric material essentially denote the vertical surfaces of the piezoelectric material when the top surface of the piezoelectric material on which the electrode structure is arranged is oriented in a horizontal position.

Correspondingly, it is possible that the plane sides of the piezoelectric material are free from chipping.

During manufacturing steps of conventional components a singulation usually concerns dicing through the carrier substrate and through the materials arranged on the carrier substrate. As the piezoelectric material and further functional layers are usually directly arranged on the carrier substrate, chipping caused by the dicing process causes defects in the side surfaces of the piezoelectric material and/or the material of further functional layers. Such defects can substantially degrade the acoustic performance of a resonator resulting in a substantial decrease of the electro acoustic performance of the corresponding filter component.

Thus, by providing intact, plane sides of the piezoelectric material the described electro acoustic filter component has an improved acoustic performance of the resonator and an improved electro acoustic performance of the filter.

Correspondingly, it is possible that the electro acoustic filter component further comprises a functional layer. The functional layer can be arranged on or above the electrode structure. Sides of the functional layer are also plane.

Further, it is possible that the plane sides of the functional layer are also free from chipping.

The prevention of chipping taking place at the piezoelectric material or at the material of the further functional layer also enhances the hermetical sealing of the cavity and of the active structures of the component.

It is possible that the functional layer covers the sides of the piezoelectric material.

Then, the piezoelectric material is still better protected against detrimental influences deriving from the environment.

It is possible that the functional layer is a TCF compensation layer (TCF=temperature coefficient of frequency), a trimming layer or a passivation layer. The further functional layer can comprise or consist of a material selected from a dielectric material, a nitride, silicon nitride, an oxide, a silicon oxide, silicon dioxide.

A TCF compensation layer helps to reduce or eliminate a temperature-induced drift of characteristic frequencies such as a center frequency of a band pass filter or of a band rejection filter or a characteristic frequency of a resonator such as a resonance frequency or an anti-resonance frequency.

A trimming layer can be used to set the characteristic frequencies of the resonator and therefore of the filter, e.g. by trimming the thickness of the trimming layer in a trimming process. A passivation layer can be used to seal the material below the passivation layer against detrimental influences.

A silicon oxide such as silicon dioxide is a material well-suited to provide a TCF compensation layer. A nitride layer is well-suited to provide protection in the form of a passivation layer.

It is possible that the electro acoustic filter component involves SAW resonators or BAW resonators. Specifically, it is possible that the electrode structure is the electrode structure of one or more SAW resonators including interdigitated electrode fingers electrically connected to one of two busbars of a resonator.

It is possible that the cavity is formed by a thin film package (TFAP). A thin film package is characterized in that a cavity is at least partially enclosed by a thin film layer.

A thin film is a layer that consists of or that comprises a material that is deposited utilizing a thin film technique such as sputtering or the like.

The thin film package can be manufactured utilizing a sacrificial material that defines the later position and shape of the cavity below the thin film protection cap.

It is possible that the piezoelectric material is arranged on or above a carrier substrate.

The carrier substrate may comprise or consist of silicon.

The carrier substrate may be provided as a wafer material that is singulated into individual pieces during a dicing process.

It is possible that the piezoelectric material and/or the functional layer has the extension in a lateral direction that is smaller than the extension of the carrier substrate in the corresponding lateral direction.

This difference in lateral direction can be obtained by a corresponding structuring process of the piezoelectric material and/or the material of the functional structure. Thus, at the position of the later dicing no material of the piezoelectric layer or of the further functional layer is present. Thus, when dicing takes place no dicing defects can occur in the piezoelectric material and/or in the material of the functional layer. Thus, the sides of the piezoelectric material and of the functional layer are maintained intact and do not have chipping defects due to dicing.

Correspondingly, it is possible that the carrier substrate has diced sides. The diced sides can comprise chipping defects although it is preferred that the carrier substrate is free from chipping defects too.

It is possible that the component further comprises an additional layer between the piezoelectric material and the carrier substrate.

It is possible that the additional layer is a waveguiding layer.

Specifically, a waveguiding material for the additional layer can comprise an oxide such as a silicon oxide such as silicon dioxide. It is preferred that the material of the waveguiding layer has a lower acoustic impedance than the piezoelectric material such that acoustic energy is confined—due to reflection at the interface between the material of different acoustic impedance—to the interface area between the electrode structure and the piezoelectric material. Also, if the waveguiding layer comprises silicon dioxide, then the waveguiding layer can contribute to or cause the temperature-induced drift compensation of the characteristic frequencies.

Corresponding to the features described above, a method of manufacturing an electro acoustic filter component comprises the steps:
  providing a wafer material as a material for carrier substrates,
  arranging a piezoelectric material on or above the wafer material,
  structuring an electrode structure on the piezoelectric material,
  dicing the wafer material into individual pieces.

When dicing the material into individual pieces the wafer material is free from the piezoelectric material at the specific dicing positions.

Further, it is possible that the piezoelectric material is structured before the dicings to have no piezoelectric material at the later dicing positions.

Correspondingly, it is also possible that the later dicing positions are free from material of the functional layer. This can be obtained by having also structured the material of the functional layer such that the dicing positions of the carrier substrate and its wafer are free from these materials.

Central aspects of the electro acoustic filter component and the method and details of preferred embodiments are shown in the accompanying schematic figures.

Figure 2:
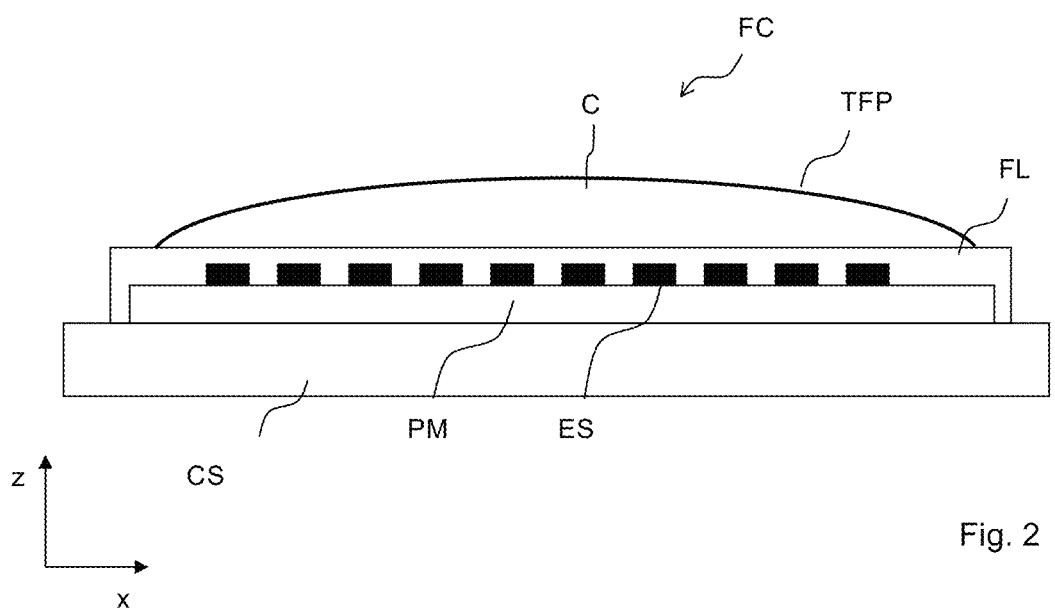
Figure 3:
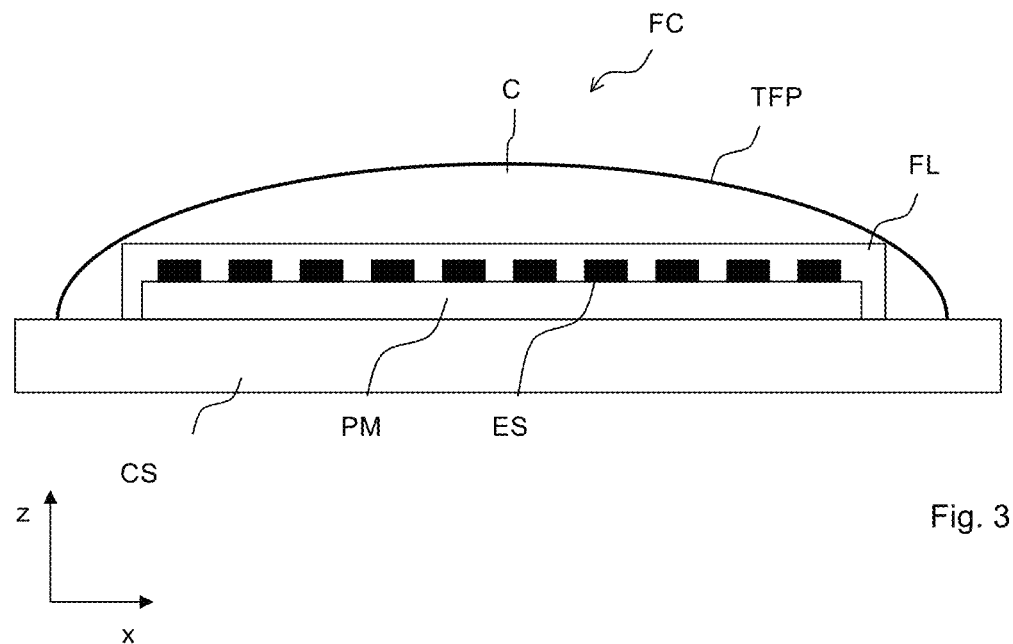
Figure 4:
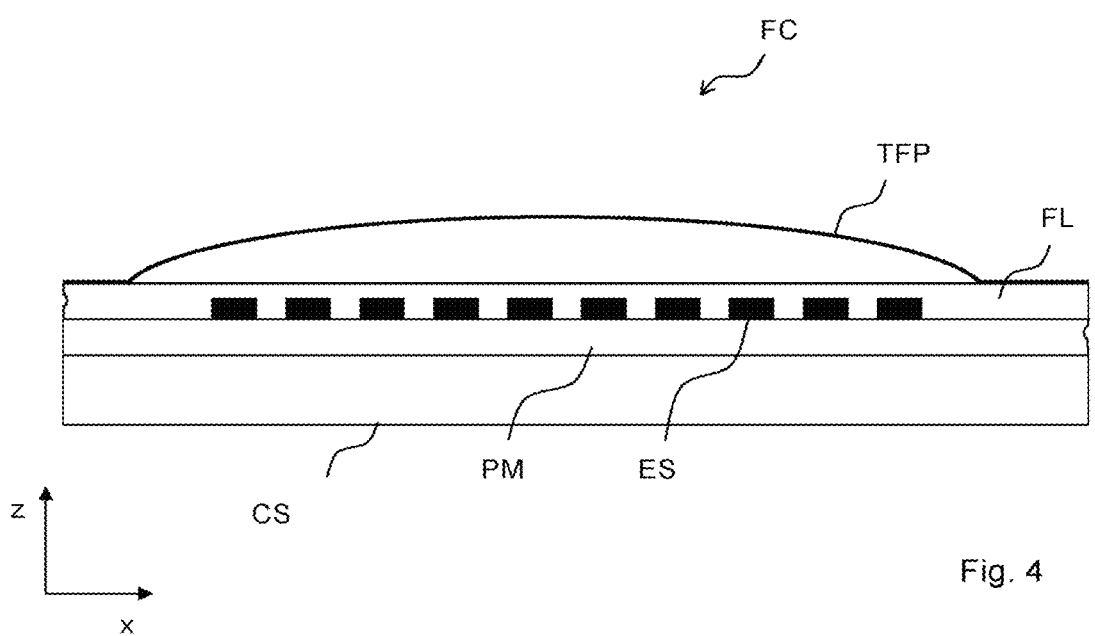
Figure 5:
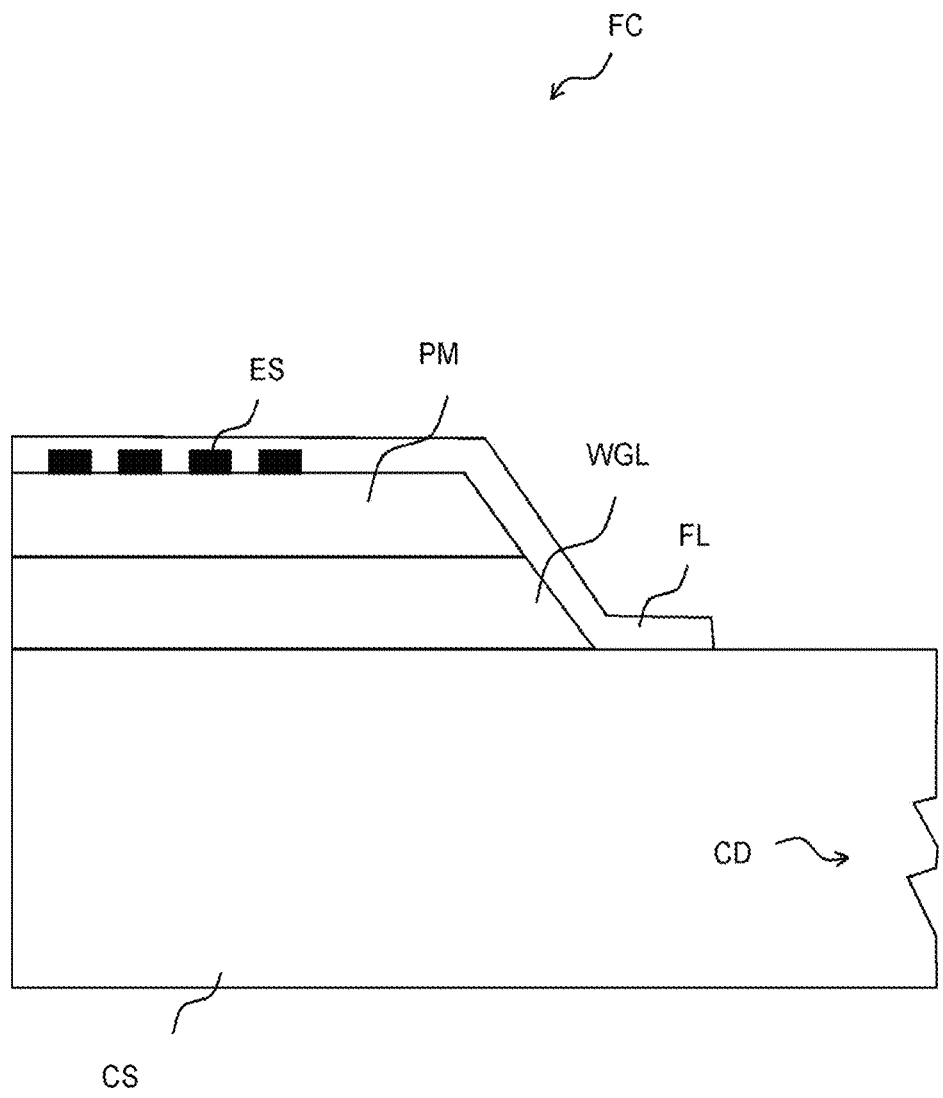
Figure 5:
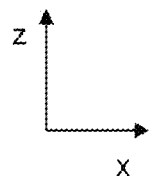

In the figures:
  FIG. 1 shows a cross-section through an electro acoustic filter component FC comprising intact sides of the piezoelectric material;
  FIG. 2 shows the possibility of covering the sides of the piezoelectric material with material of the functional layer;
  FIG. 3 shows the possibility of enclosing the piezoelectric material and the functional layer within the cavity enclosed by the thin film package and the carrier substrate, too;
  FIG. 4 illustrates a cross-section through an electro acoustic filter component having chipping defects in the piezoelectric material and in the functional layer.
  FIG. 5 shows the possibility of a arranging the functional layer between the piezoelectric material and the carrier substrate.

FIG. 1 shows a cross-section through an electro acoustic filter component FC with an improved acoustic performance. The component comprises a carrier substrate CS on which the piezoelectric material PM is arranged in a piezoelectric layer. On the piezoelectric material PM an electrode structure ES is arranged. The electrode structure ES comprises interdigitated electrode fingers extending along the transversal direction y perpendicular to the longitudinal direction x and to the vertical direction z. The electrode structure ES is covered by material of a functional layer FL. The top surface of the active structure comprising the electrode structure in the piezoelectric material is covered by the thin film cap of a thin film package TFP.

The lateral extension of the piezoelectric material PM in a longitudinal direction x or in a lateral direction y being smaller than the corresponding extension of the carrier substrate CS allows that the dicing tool that is used to singulate the pieces for the carrier substrate CS does not get in contact with the piezoelectric material PM. Thus, the sides of the piezoelectric material PM is free from defects such as chipping defects.

FIG. 2 shows the possibility of extending the functional layer FL around the sides of the piezoelectric material PM to protect the corresponding sides of the piezoelectric material. Thus, the piezoelectric material is fully enclosed within the functional layer FL and the carrier substrate CS.

FIG. 3 further shows the possibility of extending the cap of the thin film TFP to the vertical position z of the top side of the carrier substrate CS such that a further improvement of the hermetical sealing is obtained.

FIG. 4, in contrast, shows a filter component FC where the piezoelectric material PM and the material of the functional layer FL is in a longitudinal direction (x) and lateral (y) essentially flush with the material of the carrier substrate CS. As a consequence thereof, chipping defects can take place in the sides of the piezoelectric material PM and in the sides of the material of the functional layer FL as indicated in FIG. 4.

FIG. 5 shows a cross-section through an electro acoustic filter component FC where an additional layer is arranged between the carrier substrate CS and the piezoelectric material PM. The additional layer can be a waveguiding layer WGL.

Further, the sides of the piezoelectric material, of the waveguiding layer and at the specific position of the functional layer FL are oriented in an angle between 0° and 90° with respect to the top surface of the carrier substrate. The angle can be in the interval from 20° to 70°.

Further, FIG. 5 shows chipping defects CD that exist in the carrier substrate at its sides but the piezoelectric material PM, the functional layer FL and the additional waveguiding layer WGL are free from chipping defects.

The electro acoustic filter component and the method of manufacturing such a component are not limited to the technical details described above or shown in the figures. Components can comprise further structural elements, e.g.

for establishing a wanted acoustic wave mode and further electrical connections to other circuit components of the filter or to an external circuit environment.

LIST OF REFERENCE SIGNS

CD: chipping defect
CS: carrier substrate
ES: electrode structure
FC: electro acoustic filter component
FL: functional layer
PM: piezoelectric material
TFP: thin film package
WGL: waveguiding layer
x: longitudinal direction
z: vertical direction
C: cavity

The invention claimed is:

1. An electro acoustic filter component, comprising:
a piezoelectric material in a piezoelectric layer disposed over a substrate;
an electrode structure arranged on the piezoelectric layer;
a functional layer encapsulating the electrode structure and sides of the piezoelectric material; and
a cavity disposed over the functional layer,
wherein the sides of the piezoelectric material are planar and wherein sides of the functional layer are planar.

2. The electro acoustic filter component according to claim 1, wherein the planar sides of the piezoelectric layer are free from chipping.

3. The electro acoustic filter component according to claim 1, wherein the planar sides of the functional layer are free from chipping.

4. The electro acoustic filter component according to claim 1, wherein the functional layer comprises:
a temperature compensation layer, a trimming layer or a passivation layer; and
a material selected from a dielectric material, a nitride, $SiN_4$, an oxide, a silicon oxide, $SiO_2$.

5. The electro acoustic filter component according to claim 1, wherein the cavity is formed by a thin film package.

6. The electro acoustic filter component according to claim 1, wherein the piezoelectric material is arranged on or above a carrier substrate.

7. The electro acoustic filter component according to claim 6, wherein the piezoelectric material or a functional layer has an extension in a lateral direction that is smaller than the extension of the carrier substrate.

8. The electro acoustic filter component according to claim 6, wherein the carrier substrate has diced sides.

9. The electro acoustic filter component according to claim 6, further comprising an additional layer between the piezoelectric material and the carrier substrate.

10. The electro acoustic filter component according to claim 9, wherein the additional layer comprises a waveguiding layer.

* * * * *